(12) United States Patent
Cheng et al.

(10) Patent No.: US 6,940,108 B2
(45) Date of Patent: Sep. 6, 2005

(54) SLOT DESIGN FOR METAL INTERCONNECTS

(75) Inventors: Tao Cheng, Kanshang (TW); Yun-Hung Wu, Taichung (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/310,314

(22) Filed: Dec. 5, 2002

(65) Prior Publication Data

US 2004/0108592 A1 Jun. 10, 2004

(51) Int. Cl.[7] .................. H01L 27/10; H01L 29/73; H01L 29/74; H01L 23/48; H01L 23/52; H01L 29/40

(52) U.S. Cl. .................. 257/211; 257/207; 257/210; 257/734; 257/758; 257/773

(58) Field of Search ................. 257/203, 207, 257/210, 211, 734, 758, 773

(56) References Cited

U.S. PATENT DOCUMENTS

| | | | | |
|---|---|---|---|---|
| 5,289,036 A | * | 2/1994 | Nishimoto | 257/774 |
| 5,329,162 A | * | 7/1994 | Nadaoka | 257/774 |
| 5,382,831 A | * | 1/1995 | Atakov et al. | 257/767 |
| 5,477,062 A | * | 12/1995 | Natsume | 257/48 |
| 5,689,139 A | * | 11/1997 | Bui et al. | 257/758 |
| 6,251,786 B1 | * | 6/2001 | Zhou et al. | 438/692 |
| 6,258,711 B1 | | 7/2001 | Laursen | 438/633 |
| 6,294,471 B1 | | 9/2001 | Tseng | 438/692 |
| 6,358,831 B1 | * | 3/2002 | Liu et al. | 438/612 |
| 6,417,572 B1 | * | 7/2002 | Chidambarrao et al. | 257/773 |
| 6,424,014 B2 | * | 7/2002 | Sasaki et al. | 257/368 |
| 6,429,521 B1 | * | 8/2002 | Wada et al. | 257/758 |
| 6,522,021 B2 | * | 2/2003 | Sakihama et al. | 257/784 |
| 6,548,902 B2 | * | 4/2003 | Suzuki et al. | 257/758 |

* cited by examiner

Primary Examiner—Nathan J. Flynn
Assistant Examiner—Victor A. Mandala, Jr.

(57) ABSTRACT

A slot design for a metal interconnect line comprising a metal interconnect including at least two metal sub-interconnect lines that intersect to form an intersection area. At least one of the metal sub-interconnect lines having elongated slots formed therein with the elongated slots each having an axis extending through the intersection area. The intersection area having an effective cross-sectional area that is at least equal to the effective cross-sectional area of at least one of the metal sub-interconnect lines having elongated slots formed therein.

60 Claims, 4 Drawing Sheets

SLOT DESIGN FOR METAL INTERCONNECTS

FIELD OF THE INVENTION

The present invention relates generally to semiconductor fabrication and more specifically to slot designs for metal interconnects.

BACKGROUND OF THE INVENTION

The purpose of slots in wide copper metal structures is to release thermal stress and reduce dishing effects during copper chemical mechanical polishing (CMP).

U.S. Pat. No. 6,251,786 B1 to Zhou et al. describes a dual damascene process with reduced dishing.

U.S. Pat. No. 6,358,831 B1 to Liu et al. describes a bonding pad process that reduces dishing.

U.S. Pat. No. 6,258,711 B1 to Laursen describes a metal planarization process.

U.S. Pat. No. 6,294,471 B1 to Tseng describes a chemical mechanical process (CMP) for a conductive structure.

SUMMARY OF THE INVENTION

Accordingly, it is an object of one or more embodiments of the present invention to provide an improved slot design for a metal interconnect line.

Other objects will appear hereinafter.

It has now been discovered that the above and other objects of the present invention may be accomplished in the following manner. Specifically, a slot design for a metal interconnect line comprises a metal interconnect including at least two metal sub-interconnect lines that intersect to form an intersection area. At least one of the metal sub-interconnect lines having elongated slots formed therein with the elongated slots each having an axis extending through the intersection area. The intersection area having an effective cross-sectional area that is at least equal to the effective cross-sectional area of at least one of the metal sub-interconnect lines having elongated slots formed therein.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Process Known to the Inventors—Not To Be Considered Prior Art

Figure 1:
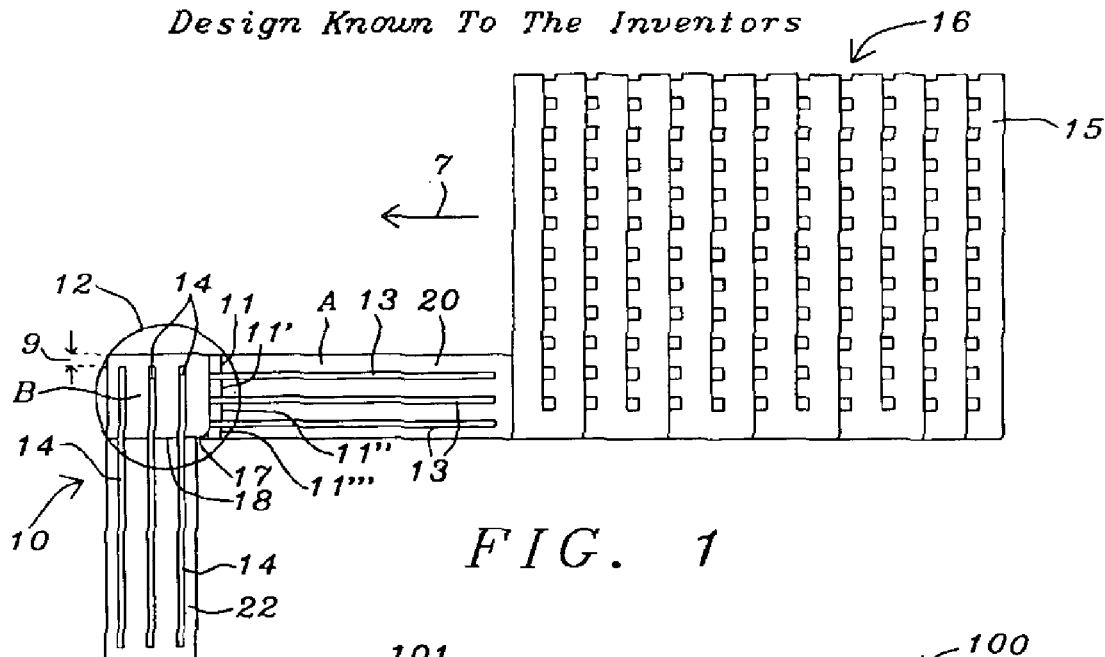
FIG. 1 schematically illustrates a wide copper, elongated slot design known to the inventors.

As shown in FIG. 1 in a design known to the inventors and not to be considered as prior art for the instant invention, copper interconnect design 16 includes a bond pad 15 connected to wide copper interconnect lines (interconnects) 20, 22 each having a slot design having respective elongated slots 13, 14.

Interconnects 20, 22 intersect as at 10 with the elongated slots 14 of interconnect 22 continuing into the intersection area 12. Intersection area 12 is defined by intersection boundaries and as shown in FIG. 1, intersection area is a corner area defined by corner boundaries 17, 18. Elongated slots 14 of interconnect 22 crossing over corner boundary 18 and into corner area 12. This design known to the inventors incurs up to about 90% burn-in open failure rate from current crowding and induced inhomogeneous current flow within the corner area 12.

With a current flow direction 7, the effective cross-sectional area in region "B" within intersection 10 (width 9 times the thickness of film "t") is less than the effective cross-sectional area in region "A"_of interconnect 20 adjacent intersection 10 ((widths 11, 11', 11" and 11''') times the thickness of film t). This creates the problem of current crowding and further, because the paths in region B isn't distributed uniformly, it induces inhomogeneous current flow.

First Embodiment—No Slots or Other Openings

Figure 2:
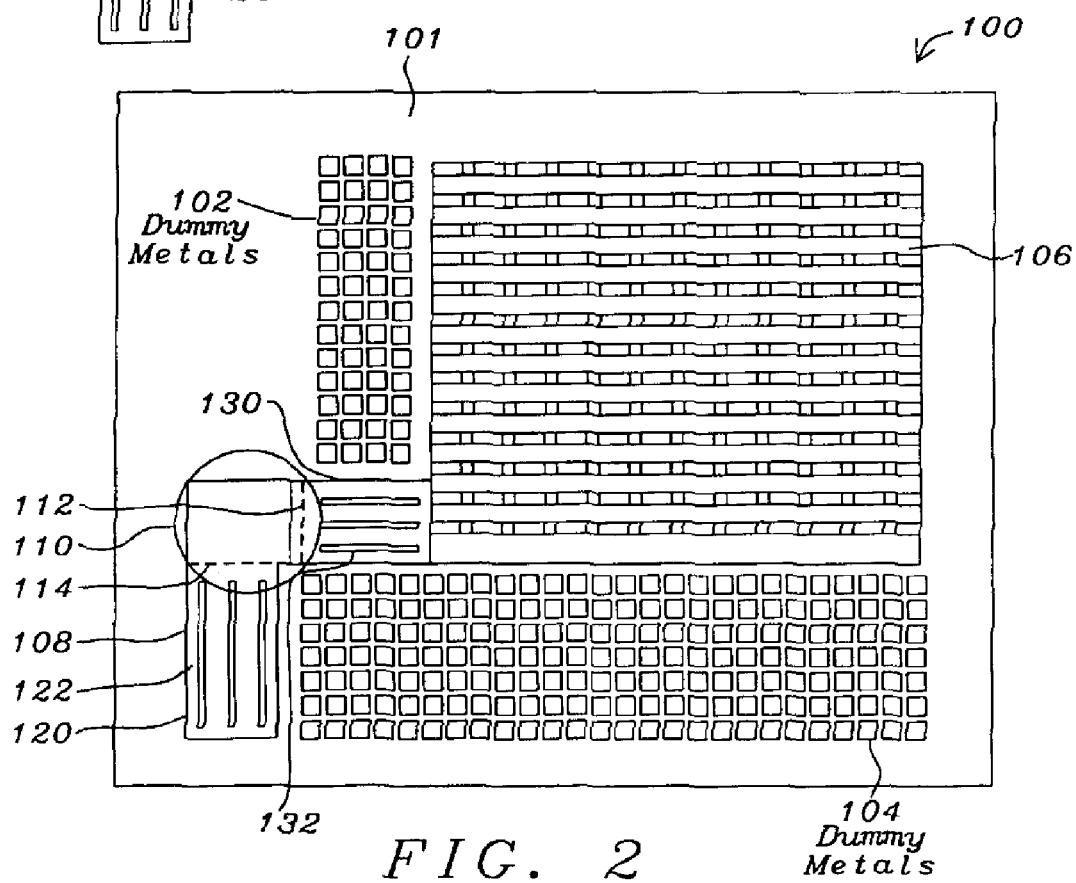
FIG. 2 schematically illustrates a first preferred embodiment of the present invention.

FIG. 2 illustrates the first embodiment of the present invention wherein a copper interconnect design 100 on a chip 101 includes a bond pad 106 and one or more metal interconnect lines (interconnects) 108 and may include one or more dummy metal regions 102, 104. Dummy metal regions 102, 104 are preferably comprised of copper, aluminum, gold or silver and are more preferably copper. Bonding pad 106 and metal interconnects 108 are preferably comprised of copper, aluminum, gold or silver and are more preferably copper.

Metal interconnect(s) 108 include substantially straight metal sub-interconnect lines (sub-interconnects) 120, 130 that intersect at approximately 90° angles to form intersection areas 110 defined by intersection boundaries 114, 112. As shown in FIG. 2 (and FIGS. 3 to 5) the intersection areas 110 are corner areas 110 defined by corner boundaries 112, 114 that segregate corner areas 110 from the intersecting metal sub-interconnects 120, 130. Metal interconnect(s) 108 and metal sub-interconnects 120, 130 are preferably comprised of copper, aluminum, gold or silver and are more preferably copper as will be used hereafter for illustrative purposes.

Figure 3:
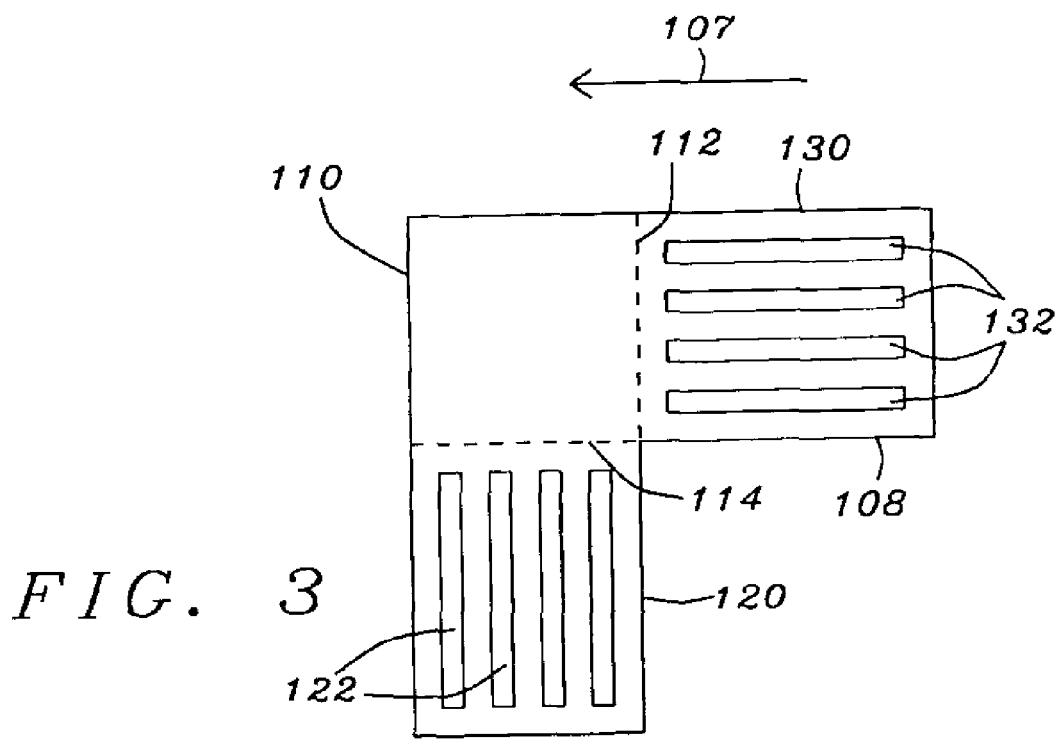
FIG. 3 schematically illustrates an enlarged view of a first preferred embodiment of FIG. 2 having no slots in the intersection area.

As shown in FIG. 2 and more clearly shown in FIG. 3 (an enlargement of the corner area of FIG. 2) copper sub-interconnects 120, 130 each (at least one) include respective elongated slots 122, 132 formed therein and, in the first embodiment of the present invention, none of the slots 122, 132 extend past the respective corner boundaries 112, 114 and into the corner areas 110; and no other opening(s) is/are formed within the corner area 110 of copper interconnect 108 so that the corner area 110 has an unbroken surface.

As one skilled in the art would understand, the upper surface unit area of corner area 110 is greater than the upper surface unit area of the sub-interconnects 120, 130 having elongated slots 122, 132; and the effective cross-sectional unit area of corner area 110 is greater than the effective cross-sectional unit area of each of the sub-interconnect 120, 130 having elongated slots 122, 132. Thus with a current flow direction 107, there is no current crowding and the current distribution is homogeneous.

Elongated slots 122, 132 each have a width of preferably from about 6000 to 30,000 Å and more preferably from about 10,000 to 15,000 Å.

Second Embodiment—Checkerboard Pattern Square Slot Openings 140

Figure 4:
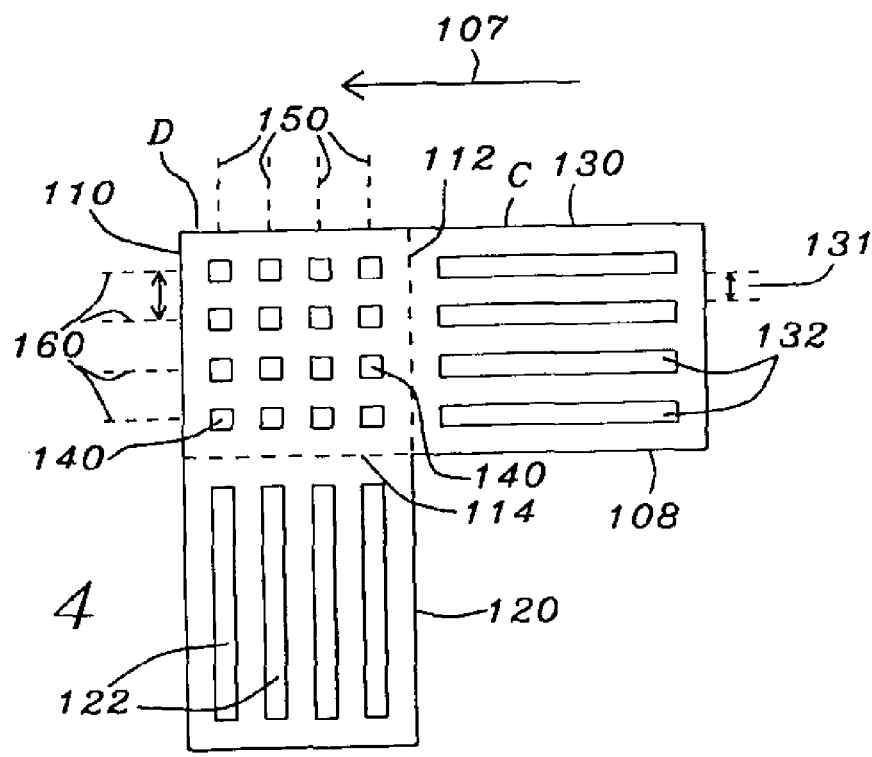
FIG. 4 schematically illustrates a second preferred embodiment of the present invention having square slots in checkerboard design in the intersection area.

As shown in FIG. 4, which is the same structure as that shown in FIG. 3 with the addition of square slot openings 140 formed within the intersection area/corner area 110 that are each aligned with each set of respective intersecting axes 150, 160 of elongated slots 122, 132 to form a 'checkerboard' pattern.

Square slot openings 140 each are preferably from about 6000 to 30,000 Å and more preferably from about 10,000 to 15,000 Å on a side.

With a current flow direction 117, the effective cross-sectional area in region "D" within intersection 110 is essentially equal to the effective cross-sectional area in region "C" of interconnect 130 adjacent intersection 110. Therefore there is no problem of current crowding and further, because the paths in region D are distributed uniformly, homogeneous current flow results.

Third Embodiment—Diamond Pattern Square Slot Openings 170

Figure 5:
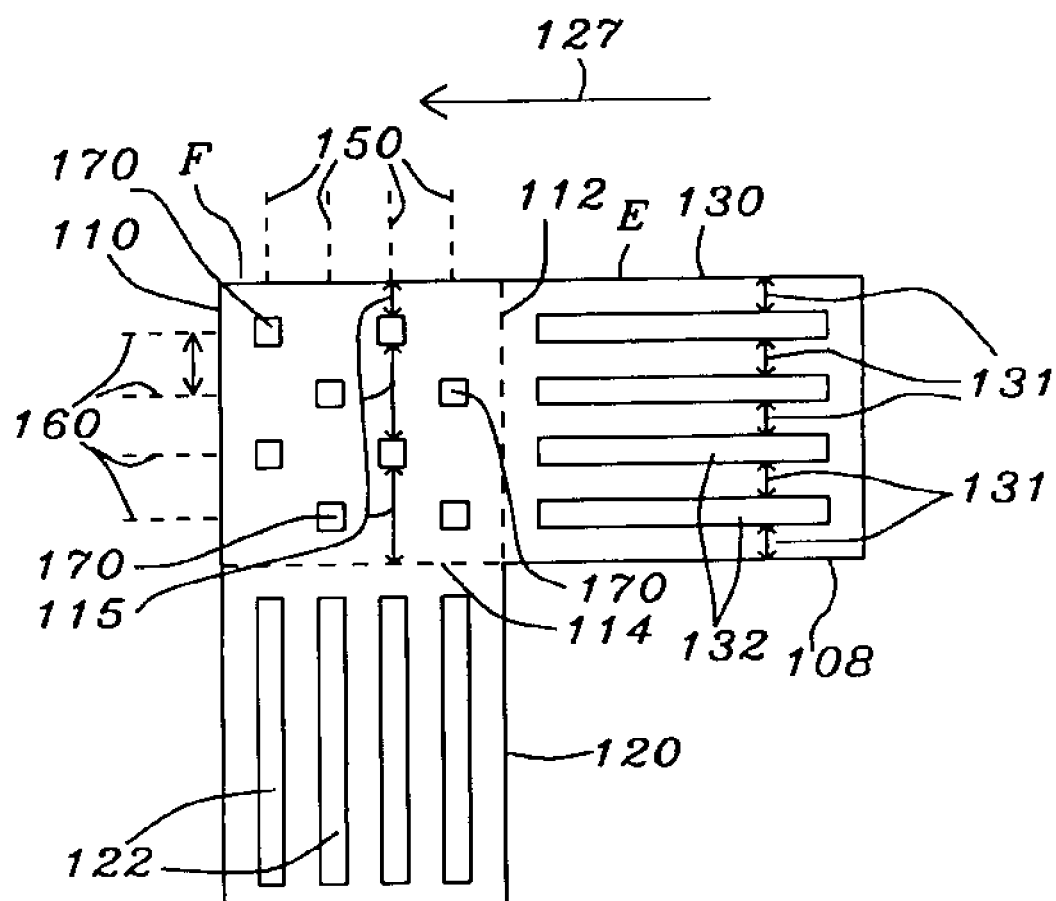
FIG. 5 schematically illustrates a third preferred embodiment of the present invention having square slots in diamond design in the intersection area.

As shown in FIG. 5, which is the same structure as that shown in FIG. 3 with the addition of square slot openings 170 formed within the intersection area/corner area 110 in a diamond pattern Each of the square slot openings 170 are aligned with the selected intersecting axes 150, 160 of elongated slots 122, 132 to form a diamond pattern as shown.

Square slot openings 170 each are preferably from about 6000 to 30,000 Å and more preferably from about 10,000 to 15,000 Å on a side.

With a current flow direction 127, the effective cross-sectional area in region "F" within intersection 110 ((widths 113+113+115)×t) is greater than the effective cross-sectional area in region "E" of interconnect 130 adjacent intersection 110 ((widths 131+131+131+131+131)×t). Therefore there is no problem of current crowding and because the paths in region F are distributed roughly uniformly, homogeneous current flow results.

It is noted that while the second and third embodiments of the present invention disclose square slot openings 140, 170 arranged in respective checkerboard and diamond patterns, such square slot opening 140, 170 may form other overall patterns within the intersections of axes 150, 160 within intersection area/corner area 110.

While the individual slot openings 140, 170 have been illustrated as having a square shape as that shape is more efficiently formed at the select points of intersection of the axes of the respective elongated slots 132, 122, the slot openings 140, 170 themselves may have other shapes rather than square, such as circular, oval, diamond, rectangular, irregular, etc., as long as slot openings 140, 170 are restricted to the areas defined by the intersection of respective axes 150, 160 (and do not cross the respective intersection boundaries/corner boundaries 112, 114).

Slot openings 140, 170 are restricted to the areas defined by the intersection of respective axes 150, 160 so as to limit their overall size. The individual slot opening 140, 170 are more preferably square in shape because that is the easiest shape to form.

Figure 6:
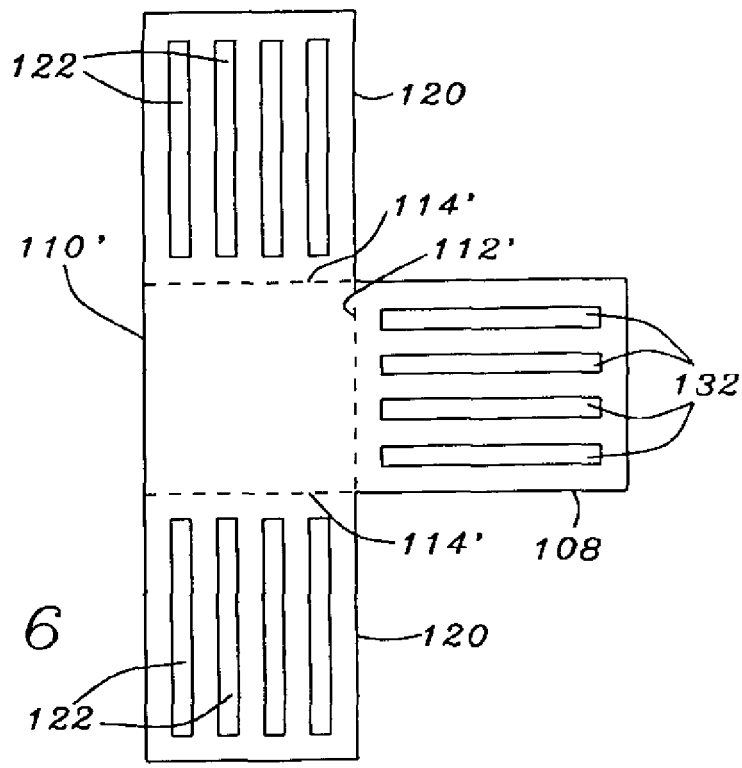
FIGS. 6 and 7 schematically illustrate alternate intersection areas.
Figure 7:
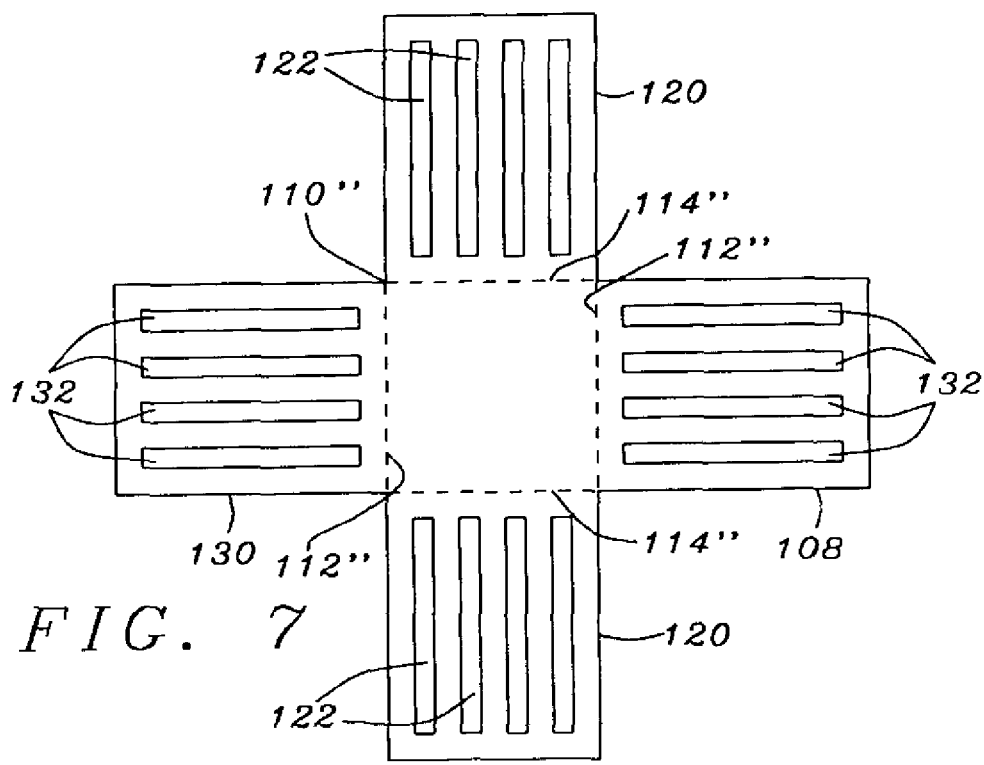

FIGS. 6 and 7 show alternate metal interconnects 108 wherein the sub-interconnects 120, 130 may intersect in a T-pattern forming an intersection area 110' defined by intersection boundaries 112', 114', as shown in FIG. 6; or in a cross-pattern forming an intersection area 110" defined by intersection boundaries 112", 114", as shown in FIG. 7.

While FIGS. 6 and 7 specifically illustrate the more preferred slotless/openless intersection areas 110', 110", the respective intersection areas 110', 110" may have the second embodiment checkerboard pattern (preferred), the third embodiment diamond pattern (preferred), or other alternate patterns (less preferred). Whether a slotless/openless intersection area 110', 110" is selected, the second embodiment checkerboard pattern is selected or the third embodiment diamond pattern is selected, the design creates similar homogeneous current distribution and the absence of current crowding as discussed in the first, second and third embodiments above.

Regardless of which of the three embodiments or alternatives disclosed herein are employed in accordance with the present invention, homogeneous current flow in the intersection areas/corner areas 110 is realized with much less product burn-in failure rate. The product burn-in open failure rate is improved to preferably from about 25 to 0% and more preferably about 0%.

ADVANTAGES OF THE PRESENT INVENTION

The advantages of one or more embodiments of the present invention include:

1. homogeneous current flow in corner areas; and
2. reduced burn-in open failure rate.

While particular embodiments of the present invention have been illustrated and described, it is not intended to limit the invention, except as defined by the following claims.

We claim:

1. A slot design for a metal interconnect line comprising: a metal interconnect including at least two metal sub-interconnect lines that intersect to form an intersection area; at least one of the metal sub-interconnect lines having elongated slots formed therein; the elongated slots terminating before the intersection area; the elongated slots each having an axis extending through the intersection area; the intersection area having an effective cross-sectional area that is at least equal to the effective cross-sectional area of the at least one of the metal sub-interconnect lines having elongated slots formed therein.

2. The slot design of claim 1, wherein the intersecting metal sub-interconnect lines are comprised of copper, aluminum, gold or silver.

3. The slot design of claim 1, wherein the intersecting metal sub-interconnect lines are comprised of copper.

4. The slot design of claim 1, wherein the effective cross-sectional area of the intersection area is greater than the effective cross-sectional area of at least one of the metal sub-interconnect lines.

5. The slot design of claim 1, wherein the intersection area has openings positioned along at least some of the respective axes of the metal sub-interconnect line slots; the openings having a shape selected from the group consisting of squares, circles, ovals, diamonds, rectangular and irregular.

6. The slot design of claim 1, wherein the intersection area has openings positioned along at least some of the respective axes of the metal sub-interconnect line slots; the openings having a square shape.

7. The slot design of claim 1, wherein the intersection area has openings positioned along at least some of the respective axes of the metal sub-interconnect line slots; the openings having a square shape with a width of from about 6000 to 30,000 Å.

8. The slot design of claim 1, wherein the intersection area has openings positioned along at least some of the respective axes of the metal sub-interconnect line slots; the openings having a square shape with a width of from about 10,000 to 15,000 Å.

9. The slot design of claim 1, wherein the intersection area having openings formed therein at each of the intersections of the respective axes to form a checkerboard design.

10. The slot design of claim 1, wherein the intersection area having openings formed therein at some of the intersections of the respective axes to form a diamond design.

11. The slot design of claim 1, wherein the at least two metal sub-interconnect lines intersect to form a corner having an intersection area that is a corner area.

12. The slot design of claim 1, wherein the at least two metal sub-interconnect lines intersect to form a T-intersection.

13. The slot design of claim 1, wherein the at least two metal sub-interconnect lines intersect to form a cross-intersection.

14. The slot design of claim 1, wherein a current flow flows along the elongated slots to the intersection area.

15. The slot design of claim 1, wherein a current flow flows along the elongated slots to the intersection area whereby there is no current crowding.

16. The slot design of claim 1, wherein a current flow flows along the elongated slots to the intersection area whereby the current distribution is homogeneous.

17. The slot design of claim 1, wherein a current flow flows along the elongated slots to the intersection area whereby there is no current crowding and the current distribution is homogeneous.

18. The slot design of claim 1, wherein the elongated slots each have a width of from about 6000 to 30,000 Å.

19. The slot design of claim 1, wherein the elongated slots each have a width of from about 10,000 to 15,000 Å.

20. The slot design of claim 1, wherein the at least two metal sub-interconnect lines each have elongated slots.

21. A slot design for a metal interconnect line comprising:
a metal interconnect including at least two metal sub-interconnect lines that intersect to form an intersection area; at least one of the metal sub-interconnect lines having elongated slots formed therein; the elongated slots terminating before the intersection area; the elongated slots each having an axis extending through the intersection area; the intersection area having an effective cross-sectional area that is at least equal to the effective cross-sectional area of the at least one of the metal sub-interconnect lines having elongated slots formed therein; wherein the intersecting metal sub-interconnect lines are comprised of copper, aluminum, gold or silver.

22. The slot design of claim 21, wherein the intersecting metal sub-interconnect lines are comprised of copper.

23. The slot design of claim 21, wherein the effective cross-sectional area of the intersection area is greater than the effective cross-sectional area of at least one of the metal sub-interconnect lines.

24. The slot design of claim 21, wherein the intersection are has openings positioned along at least some of the respective axes of the metal sub-interconnect line slots; the openings having a shape selected from the group consisting of squares, circles, ovals, diamonds, rectangular and irregular.

25. The slot design of claim 21, wherein the intersection area has openings positioned along at least some of the respective axes of the metal sub-interconnect line slots; the openings having a square shape.

26. The slot design of claim 21, wherein the intersection area has openings positioned along at least some of the respective axes of the metal sub-interconnect line slots; the openings having a square shape with a width of from about 6000 to 30,000 Å.

27. The slot design of claim 21, wherein the intersection area has openings positioned along at least some of the respective axes of the metal sub-interconnect line slots; the openings having a square shape with a width of from about 10,000 to 15,000 Å.

28. The slot design of claim 21, wherein the intersection area having openings formed therein at each of the intersections of the respective axes to form a checkerboard design.

29. The slot design of claim 21, wherein the intersection area having openings formed therein at some of the intersections of the respective axes to form a diamond design.

30. The slot design of claim 21, wherein the at least two metal sub-interconnect lines intersect to form a corner having an intersection area that is a corner area.

31. The slot design of claim 21, wherein the at least two metal sub-interconnect lines intersect to form a T-intersection.

32. The slot design of claim 21, wherein the at least two metal sub-interconnect lines intersect to form a cross-intersection.

33. The slot design of claim 21, wherein a current flow flows along the elongated slots to the intersection area.

34. The slot design of claim 21, wherein a current flow flows along the elongated slots to the intersection area whereby there is no current crowding.

35. The slot design of claim 21, wherein a current flow flows along the elongated slots to the intersection area whereby the current distribution is homogeneous.

36. The slot design of claim 21, wherein a current flow flows along the elongated slots to the intersection area whereby there is no current crowding and the current distribution is homogeneous.

37. The slot design of claim 21, wherein the elongated slots each have a width of from about 6000 to 30,000 Å.

38. The slot design of claim 21, wherein the elongated slots each have a width of from about 10,000 to 15,000 Å.

39. The slot design of claim 21, wherein the at least two metal sub-interconnect lines each have elongated slots.

40. A slot design for a metal interconnect line comprising:
a metal interconnect including at least two metal sub-interconnect lines that intersect to form an intersection area; at least one of the metal sub-interconnect lines having elongated slots formed therein; the elongated slots terminating before the intersection area; the elongated slots each having an axis extending through the intersection area; the intersection area having an effective cross-sectional area that is at least equal to the effective cross-sectional area of the at least one of the metal sub-interconnect lines having elongated slots formed therein; wherein a current flow flows along the elongated slots to the intersection area.

41. The slot design of claim 40, wherein the intersecting metal sub-interconnect lines are comprised of copper, aluminum, gold or silver.

42. The slot design of claim 40, wherein the intersecting metal sub-interconnect lines are comprised of copper.

43. The slot design of claim 40, wherein the effective cross-sectional area of the intersection area is greater than the effective cross-sectional area of at least one of the metal sub-interconnect lines.

44. The slot design of claim 40, wherein the intersection area has openings positioned along at least some of the respective axes of the metal sub-interconnect line slots; the openings having a shape selected from the group consisting of squares, circles, ovals, diamonds, rectangular and irregular.

45. The slot design of claim 40, wherein the intersection area has openings positioned along at least some of the respective axes of the metal sub-interconnect line slots; the openings having a square shape.

46. The slot design of claim 40, wherein the intersection area has openings positioned along at least some of the respective axes of the metal sub-interconnect line slots; the openings having a square shape with a width of from about 6000 to 30,000 Å.

47. The slot design of claim 40, wherein the intersection area has openings positioned along at least some of the respective axes of the metal sub-interconnect line slots; the openings having a square shape with a width of from about 10,000 to 15,000 Å.

48. The slot design of claim 40, wherein the intersection area having openings formed therein at each of the intersections of the respective axes to form a checkerboard design.

49. The slot design of claim 40, wherein the intersection area having openings formed therein at some of the intersections of the respective axes to form a diamond design.

50. The slot design of claim 40, wherein the at least two metal sub-interconnect lines intersect to form a corner having an intersection area that is a corner area.

51. The slot design of claim 40, wherein the at least two metal sub-interconnect lines intersect to form a T-intersection.

52. The slot design of claim 40, wherein the at least two metal sub-interconnect lines intersect to form a cross-intersection.

53. The slot design of claim 40, whereby there is no current crowding.

54. The slot design of claim 40, whereby the current distribution is homogeneous.

55. The slot design of claim 40, whereby there is no current crowding and the current distribution is homogeneous.

56. The slot design of claim 40, wherein the elongated slots each have a width of from about 6000 to 30,000 Å.

57. The slot design of claim 40, wherein the elongated slots each have a width of from about 10,000 to 15,000 Å.

58. The slot design of claim 40, wherein the at least two metal sub-interconnect lines each have elongated slots.

59. A slot design for a metal interconnect line comprising:

a metal interconnect including at least two metal sub-interconnect lines that intersect to form an intersection area;

at least one of the metal sub-interconnect lines having elongated slots formed therein; the elongated slots terminating before the intersection area; and the intersection area having an effective cross-sectional area that is at least equal to the effective cross-sectional area of the at least one of the metal sub-interconnect lines having elongated slots formed therein.

60. A metal interconnect line comprising:

at least two metal sub-interconnect lines that intersect to form an intersection area;

at least one of the metal sub-interconnect lines having elongated slots formed therein; the elongated slots terminating before the intersection area; and the intersection area having an effective cross-sectional area that is at least equal to the effective cross-sectional area of the at least one of the metal sub-interconnect lines having elongated slots formed therein.

* * * * *